US008238416B2

(12) United States Patent
Oh et al.

(10) Patent No.: US 8,238,416 B2

(45) Date of Patent: Aug. 7, 2012

(54) APPARATUSES AND METHODS FOR TRANSMITTING AND RECEIVING UNCOMPRESSED AV DATA

(75) Inventors: Ji-sung Oh, Seongnam-si (KR); Joong-suk Park, Seongnam-si (KR); Yeon-woo Lee, Yongin-si (KR); Jung-Won Kwak, Gangnam-gu (KR); Sung-wook Cha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1444 days.

(21) Appl. No.: 11/651,041

(22) Filed: Jan. 9, 2007

(65) Prior Publication Data

US 2007/0165674 A1 Jul. 19, 2007

Related U.S. Application Data

(60) Provisional application No. 60/759,058, filed on Jan. 17, 2006.

(30) Foreign Application Priority Data

Sep. 19, 2006 (KR) ........................ 10-2006-0090884

(51) Int. Cl.
*H04J 3/00* (2006.01)

(52) U.S. Cl. ................................................. 375/240.01

(58) Field of Classification Search ........................ None
See application file for complete search history.

(56) References Cited

U.S. PATENT DOCUMENTS 4,694,336 A 9/1987 Keesen et al.
5,140,621 A 8/1992 Perron et al.
5,832,001 A * 11/1998 Choi ............................ 714/790
5,966,374 A * 10/1999 Rasanen ....................... 370/337
6,223,324 B1 * 4/2001 Sinha et al. .................. 714/776
6,442,729 B1 * 8/2002 Kim et al. ..................... 714/786
6,728,300 B1 4/2004 Sarkar et al.
6,851,083 B1 2/2005 Hagenauer et al.

(Continued)

FOREIGN PATENT DOCUMENTS

EP 0702476 A2 3/1996
JP 4-260237 A 9/1992
JP 8-46655 A 2/1996
JP 2005-175645 A 6/2005
KR 10-0218680 B1 6/1999

(Continued)

OTHER PUBLICATIONS

Communication dated Jun. 27, 2011 in counterpart Japanese Patent Application No. 2008-551173.

*Primary Examiner* — Thai Tran
*Assistant Examiner* — Sunghyoun Park
(74) *Attorney, Agent, or Firm* — Sughrue Mion, PLLC

(57) ABSTRACT

Apparatuses and methods are provided for transmitting and receiving uncompressed audio or video (AV) data by applying a different coding rate to each bit or each group of bits included in the uncompressed AV data according to significance of each bit or each group of bits. The apparatus for transmitting the uncompressed AV data includes a grouping unit which classifies bits of each pixel included in the uncompressed AV data into at least two groups of bits according to a significance of the bits; an encoding unit which performs error correction encoding on each of the at least two groups using a different coding rate; and a radio frequency (RF) processing unit which transmits the encoded, uncompressed AV data, which includes the pixels on which the error-correction encoding was performed, using a communication channel.

34 Claims, 9 Drawing Sheets

U.S. PATENT DOCUMENTS

| | | | | |
|---|---|---|---|---|
| 6,865,709 | B2 * | 3/2005 | Dillinger et al. | 714/790 |
| 7,251,461 | B2 * | 7/2007 | Shoji et al. | 455/101 |
| 2001/0012277 | A1 * | 8/2001 | Campanella | 370/323 |
| 2001/0017724 | A1 * | 8/2001 | Miyamoto et al. | 359/158 |
| 2001/0045900 | A1 * | 11/2001 | Murayama et al. | 341/94 |
| 2002/0018452 | A1 * | 2/2002 | Cha | 370/329 |
| 2003/0161347 | A1 * | 8/2003 | Metchalf | 370/493 |
| 2007/0136637 | A1 | 6/2007 | Majima et al. | |

FOREIGN PATENT DOCUMENTS

| | | | |
|---|---|---|---|
| KR | 10-0255762 | B1 | 2/2000 |
| KR | 10-0320220 | B1 | 12/2001 |
| KR | 10-0328764 | B1 | 3/2002 |
| KR | 10-0519334 | B1 | 9/2005 |
| WO | WO 01/60104 | A1 | 8/2001 |
| WO | 2004/040773 | A1 | 5/2004 |

* cited by examiner

APPARATUSES AND METHODS FOR TRANSMITTING AND RECEIVING UNCOMPRESSED AV DATA

CROSS-REFERENCE TO RELATED APPLICATION

This application claims priority from Korean Patent Application No. 10-2006-90884 filed on Sep. 19, 2006 in the Korean Intellectual Property Office, and U.S. Provisional Application No. 60/759,050 filed on Jan. 17, 2006 in the U.S. Patent and Trademark Office, the disclosures of which are incorporated herein in their entirety by reference.

BACKGROUND OF THE INVENTION

1. Field of the Invention

Methods and apparatuses consistent with the present invention relate to transmitting and receiving uncompressed audio or video (AV) data, and more particularly, to transmitting and receiving uncompressed AV data over a wireless network by applying a different coding rate to each bit or each group of bits included in the uncompressed AV data according to the significance of each bit or each group of bits.

2. Description of the Related Art

As networks become wireless and the demand for large multimedia data transmission increases, there is a need for studies on an effective transmission method in a wireless network environment. In particular, the need for various home devices to wirelessly transmit high-quality videos, such as digital video disk (DVD) images or high definition television (HDTV) images, is growing.

An IEEE 802.15.3c task group is developing a technological standard for transmitting large-volume data over a wireless home network. The technological standard, which is called "millimeter wave (mmWave)," uses an electric wave having a physical wavelength of a millimeter (i.e., an electric wave having a frequency band of 30-300 GHz) to transmit large-volume data. This frequency band, which is an unlicensed band, has conventionally been used by communication service providers or used for limited purposes, such as observing electric waves or preventing vehicle collision.

FIG. 1 is a diagram which compares frequency bands of IEEE 802.11 series of standards and mmWave. Referring to FIG. 1, an IEEE 802.11b or IEEE 802.11g standard uses a carrier frequency of 2.4 GHz and has a channel bandwidth of approximately 20 MHz. In addition, an IEEE 802.11a or IEEE 802.11n standard uses a carrier frequency of 5 GHz and has a channel bandwidth of approximately 20 MHz. On the other hand, mmWave uses a carrier frequency of 60 GHz and has a channel bandwidth of approximately 0.5-2.5 GHz. Therefore, it can be understood that mmWave has a far greater carrier frequency and channel bandwidth than the related art IEEE 802.11 series of standards. When a high-frequency signal (a millimeter wave) having a millimeter wavelength is used, a very high transmission rate of several Gbps can be achieved. Since the size of an antenna can also be reduced to less than 1.5 mm, a single chip which includes the antenna can be implemented. Furthermore, interference between devices can be reduced due to a very high attenuation ratio of the high-frequency signal in the air.

A method of transmitting uncompressed audio or video data (hereinafter, referred to as uncompressed AV data) between wireless devices using a high bandwidth of a millimeter wave has recently been studied. Compressed AV data is generated after lossy compression processes which includes motion compensation, discrete cosine transform (DCT), quantization, and variable length coding (VLC) processes. In so doing, portions of the compressed AV data, to which human visual and auditory senses are less sensitive, are removed. On the other hand, uncompressed AV data includes digital values indicating pixel components (for example, red (R), green (G) and blue (B) components).

Hence, bits included in the uncompressed AV data have different degrees of significance while there is no difference in the significance of bits included in the compressed AV data. For example, referring to FIG. 2, a pixel component of an eight-bit image is represented by eight bits. Of the eight bits, a bit representing the highest order (the highest-level bit) is the most significant bit (MSB), and a bit representing the lowest order (the lowest-level bit) is the least significant bit (LSB). In other words, each of eight bits that form one byte of data has a different significance in restoring an image or audio signal.

An error that occurs in a bit of high significance during data transmission can be more easily detected than an error that occurs in a bit of low significance. Therefore, bit data of high significance needs to be better protected against errors that occur during wireless transmission than bit data of low significance. However, an error correction method, in which the same coding rate is applied to all bits that are to be transmitted as in the related art transmission method used by the IEEE 802.11 series of standards, has been used.

FIG. 3 is a diagram illustrating the structure of a physical layer (PHY) protocol data unit (PPDU) 30 of the IEEE 802.11a standard. Referring to FIG. 3, the PPDU 30 includes a preamble, a signal field, and a data field. The preamble, which is a signal for PHY layer synchronization and channel estimation, includes a plurality of short training signals and a long training signal. The signal field includes a RATE field indicating a transmission rate and a LENGTH field indicating the length of the PPDU 30. Generally, the signal field is encoded by a symbol. The data field includes a physical layer service data unit (PSDU), a tail bit, and a pad bit. Data to be transmitted is included in the PSDU.

Data recorded in the PSDU is composed of codes that are encoded using a convolution encoder. Bits that form data, such as compressed AV data, are not different in terms of significance. In addition, since the bits are encoded using the same error correction encoding method, an equal error correction capability is applied to each bit.

This related art data transmission method can be effective for general data transmission. However, if each portion of data to be transmitted has a different significance, it is required to perform more superior error correction encoding on portions of greater significance in order to reduce the probability of error occurrence.

In order to prevent error occurrence, a transmitting end performs error correction encoding on data. Even if an error occurs while the error-correction encoded data is transmitted, the error-correction encoded data can be restored as long as the error is within a correctable range. There are a variety of error correction encoding algorithms, and each error correction encoding algorithm has a different error correction capability. Even the same error correction encoding algorithm may show different performances depending on a coding rate used.

In general, as the coding rate increases, data transmission efficiency is enhanced, but error correction capability is reduced. Conversely, as the coding rate decreases, data transmission efficiency is reduced, but error correction capability is enhanced. As described above, since uncompressed AV data includes bits having different degrees of significance unlike compressed AV data, upper bits, which are more significant than lower bits, need to be better protected against errors during data transmission.

Related art methods of guaranteeing stable wireless data transmission include a method of restoring data using error correction encoding and a method of re-transmitting data having an error from a transmitting end to a receiving end. In particular, the present invention relates to a method of applying differential error correction encoding to bits that form uncompressed AV data according to the significance of the bits.

SUMMARY OF THE INVENTION

The present invention provides apparatuses and methods which apply a different coding rate to each bit or each group of bits included in uncompressed audio or video (AV) data according to the significance of each bit or each group of bits when transmitting and receiving the uncompressed AV data over a wireless network.

According to an aspect of the present invention, there is provided an apparatus for transmitting uncompressed AV data. The apparatus includes a grouping unit classifying bits of each pixel included in the uncompressed AV data into at least two groups of bits according to significance of the bits; an encoding unit performing error correction encoding on each of the at least two groups using a different coding rate; and a radio frequency (RF) processing unit transmitting the encoded, uncompressed AV data, which includes the pixels on which the error-correction encoding was performed, using a communication channel.

According to another aspect of the present invention, there is provided an apparatus for receiving uncompressed AV data. The apparatus includes an RF processing unit receiving, through a communication channel, the uncompressed AV data comprised of pixels including bits which were classified into at least two groups of bits according to significance of the bits and to each group of which a different coding rate was applied; a decoding unit performing different error correction decoding on each group using the different coding rate; and a bit combination unit combining the at least two groups on which the error correction decoding was performed and generating decoded, uncompressed AV data.

According to another aspect of the present invention, there is provided a method of transmitting uncompressed AV data. The method includes classifying bits of each pixel included in the uncompressed AV data into at least two groups of bits according to significance of the bits; performing error correction encoding on each of the at least two groups using a different coding rate; and transmitting the encoded, uncompressed AV data, which includes the pixels on which the error-correction encoding was performed, using a communication channel.

According to another aspect of the present invention, there is provided a method of receiving uncompressed AV data. The method includes receiving, through a communication channel, the uncompressed AV data comprised of pixels including bits which were classified into at least two groups of bits according to significance of the bits and to each group of which a different coding rate was applied; performing different error correction decoding on each group using the different coding rate; and combining the at least two groups on which the error correction decoding was performed and generating decoded, uncompressed AV data.

BRIEF DESCRIPTION OF THE DRAWINGS

The above and other aspects of the present invention will become more apparent by describing in detail certain exemplary embodiments thereof with reference to the attached drawings, in which.

DETAILED DESCRIPTION EXEMPLARY EMBODIMENTS OF THE INVENTION

Figure 1:
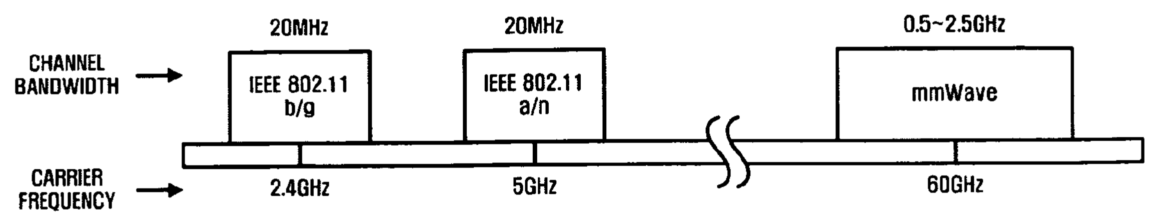
FIG. 1 is a diagram comparing frequency bands of IEEE 802.11 series of standards and mmWave.

The present invention will now be described more fully with reference to the accompanying drawings, in which exemplary embodiments of the invention are shown. The invention may, however, be embodied in many different forms and should not be construed as being limited to the exemplary embodiments set forth herein; rather, these exemplary embodiments are provided so that this disclosure will be thorough and complete, and will fully convey the concept of the invention to those skilled in the art. Like reference numerals in the drawings denote like elements, and thus their description will be omitted.

Embodiments of the present invention will hereinafter be described in detail with reference to the accompanying drawings.

Figure 4:
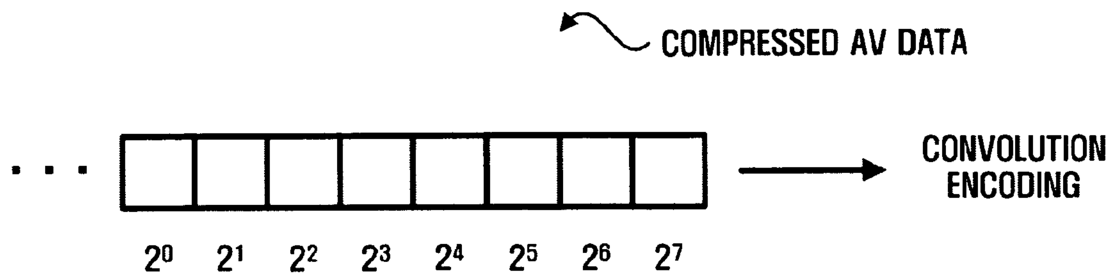
FIG. 4 is a diagram illustrating a related art error correction encoding method.
Figure 5:
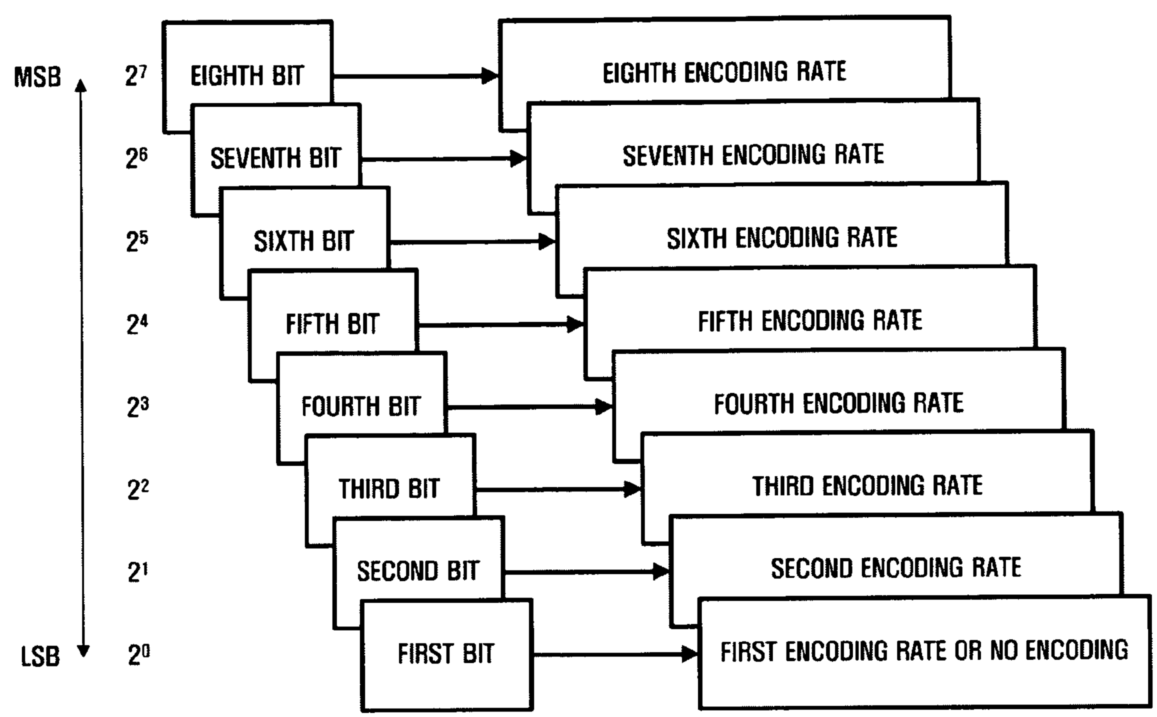
FIG. 5 is a diagram illustrating an error correction method according to an exemplary embodiment of the present invention.

FIG. 4 is a diagram illustrating a related art error correction encoding method, and FIG. 5 is a diagram illustrating an error correction method according to an exemplary embodiment of the present invention.

Compressed AV data is generated after the processes for enhancing a compression rate, such as quantization and entropy-encoding. Therefore, there is no difference in priority or significance between bits that form each pixel of the compressed AV data. In this regard, referring to FIG. 4, the related art compressed AV data is error-correction encoded using a fixed coding rate. Even if the related art compressed AV data is error-correction encoded using a variable coding rate, such error-correction encoding is based on external conditions such as communication environments, but not based on significance of each data bit.

Figure 2:
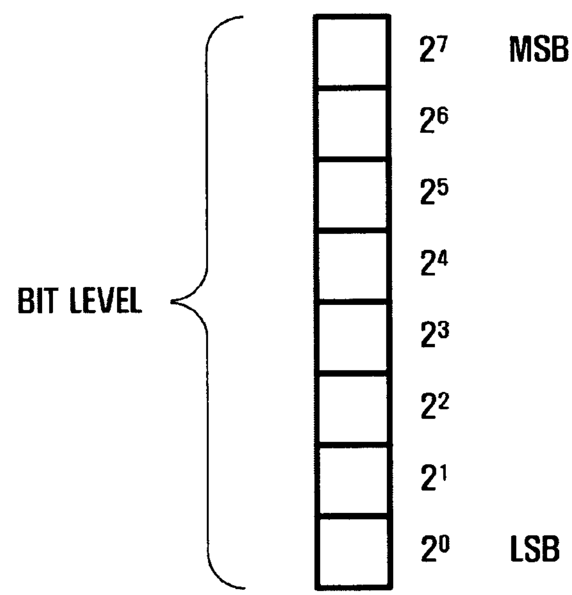
FIG. 2 is a diagram illustrating a plurality of bits levels of a pixel component.
Figure 3:
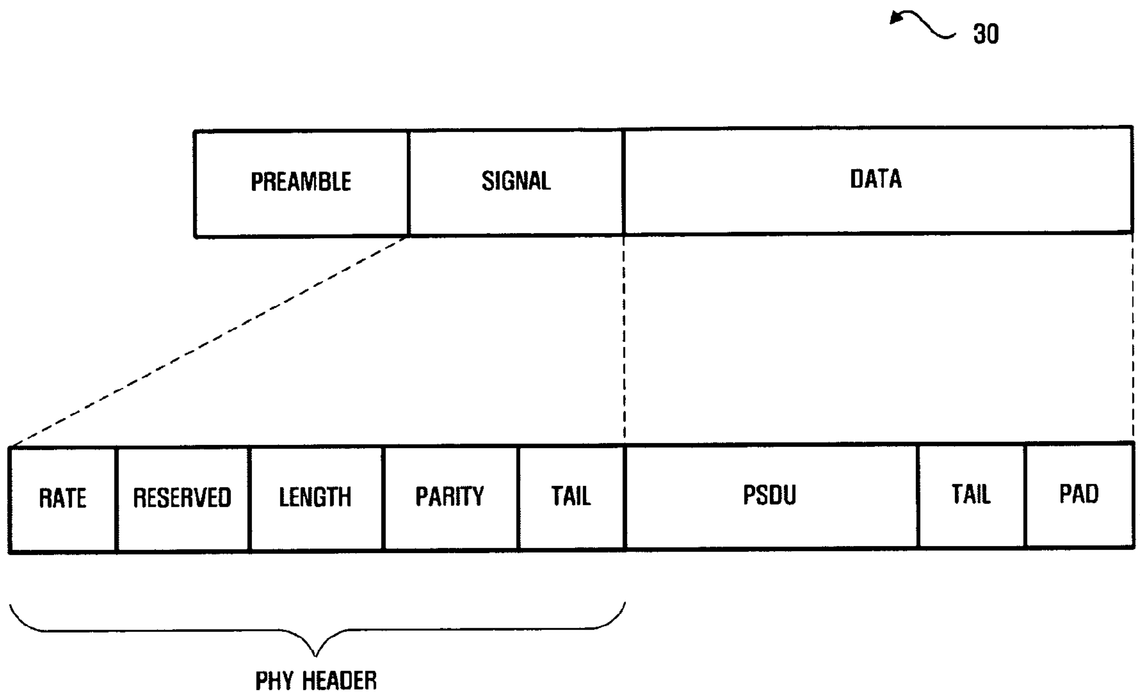
FIG. 3 is a diagram illustrating the structure of a PPDU of an IEEE 802.11a standard.

However, as described above with reference to FIG. 2, each bit of uncompressed AV data has a different significance according to a bit level. Therefore, it may be desirable to error-correction encode a plurality of bits included in each pixel of the uncompressed AV data using different coding rates according to bit levels as illustrated in FIG. 5.

However, if all bits are error-correction encoded using different coding rates, the amount of computation required of a transmitting device and a receiving device may increase. Therefore, a plurality of bits are divided into several groups according to bit levels, and each group may be error-correction encoded using a different coding rate. In this case, a lower coding rate is applied to bits included in groups of relatively greater significance. As described above, the present invention seeks to enhance transmission efficiency of the uncompressed AV data by applying different coding rates to bits according to significance of the bits.

It will be understood that each block in block diagrams, and combinations of blocks in flowchart illustrations, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions specified in each block of the block diagrams or each flowchart block of the flowchart illustrations.

These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in each block of the block diagrams or each flowchart block of the flowchart illustrations.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in each block of the block diagrams or each flowchart block of the flowchart illustrations.

And each block or each flowchart block may represent a module, segment, or portion of code, which comprises one or more executable instructions for implementing the specified logical function(s). It should also be noted that in some alternative implementations, the functions noted in the blocks or flowchart blocks may occur out of the order. For example, two blocks or flowchart blocks shown in succession may in fact be executed substantially concurrently. Alternatively, the blocks or flowchart blocks may sometimes be executed in the reverse order, depending upon the functionality involved.

Figure 6:
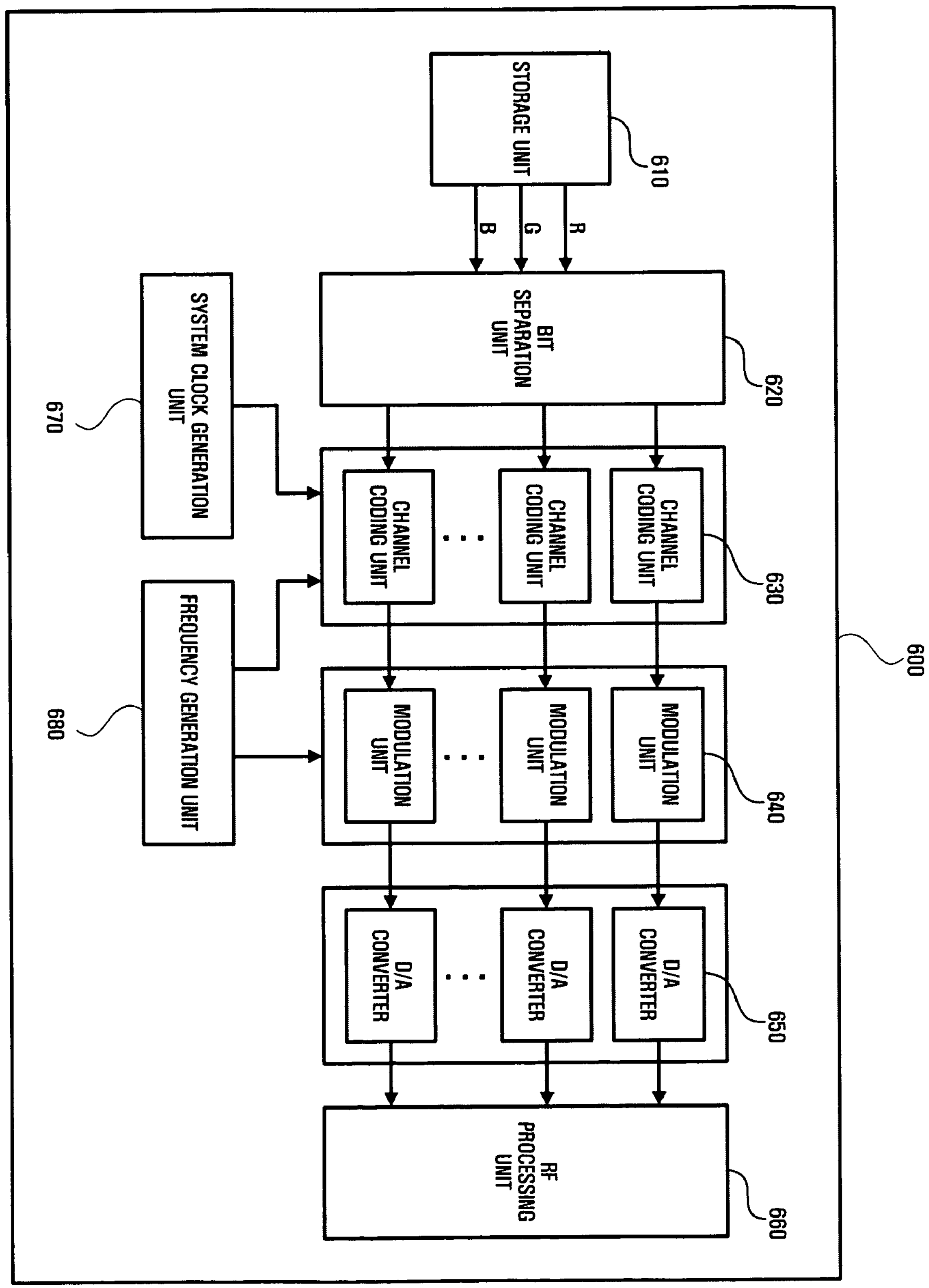
FIG. 6 is a block diagram of an apparatus for transmitting uncompressed AV data according to an exemplary embodiment of the present invention.

FIG. 6 is a block diagram of an apparatus 600 for transmitting uncompressed AV data according to an exemplary embodiment of the present invention. Referring to FIG. 6, the apparatus 600 includes a storage unit 610, a bit separation unit 620, a plurality of channel coding units 630, a plurality of modulation units 640, a plurality of digital-to analog (D/A) converters 650, an RF processing unit 660, a system clock generation unit 670, and a frequency generation unit 680.

The storage unit 610 stores uncompressed AV data. If the uncompressed AV data is video data, values of sub-pixels of each pixel are stored in the storage unit 610. Various sub-pixels values may be stored according to a color space used (for example, an RGB color space or a YCbCr color space). The description of the present invention will be made based on the assumption that each pixel is composed of three sub-pixels, i.e., R, G and B sub-pixels, according to an RGB color space. If the video data is a grey image, only one sub-pixel component exists. Therefore, a pixel may be composed of one sub-pixel, or two or four sub-pixel components.

The bit separation unit 620 separates the sub-pixel values (binary values) provided by the storage unit 610 into the highest-order (level) to lowest-order (level) bits. For example, since 8-bit video data has an order ranging from $2^7$ to $2^0$, the sub-pixel values may be divided into 8 bits. This bit separation process is performed independently for each sub-pixel.

In the bit separation process, the bit separation unit 620 may divide input RGB data into a number of groups and uniformly distribute the groups of RGB data to a plurality of frequency channels. For example, it is assumed that three frequency channels (first through third frequency channels) are supported and that R data is placed in the first frequency channel, G data is placed in the second channel, and B data is placed in the third channel. In this case, if there is a problem with the first channel, a video displayed by an apparatus for receiving uncompressed AV data may not be able to properly express red. Therefore, the bit separation unit 620 places an equal number of pieces of RGB data in each frequency channel. Consequently, even if one of the frequency channels has a problem, the video displayed by the apparatus can maintain a uniform color on the whole.

For each frequency channel, the channel coding units 630 error-correction encode bits, which were separated by the bit separation unit 620, using appropriate coding rates according to significance of the bits and generate a payload. To this end, the channel coding units 630 may be implemented for each frequency channel.

Error-correction encoding performed by the channel coding units 630 is largely divided into block encoding and convolution encoding. Block encoding (e.g., Reed-Solomon encoding) is a technology which encodes data in units of certain blocks, and convolution encoding is a technology which performs encoding by comparing previous data with current data using a memory with a certain length. Block encoding is known to be inherently resistant to burst errors, and convolution encoding is known to be inherently resistant to random errors.

Generally, in error-correction encoding, input k bits are converted into an n-bit codeword. In this case, the coding rate is given by "k/n." As the coding rate decreases, input bits are encoded into a codeword having bits greater than the input bits. Therefore, the efficiency of error correction can be enhanced. The channel coding units 630 will be described in detail later with reference to FIG. 7.

The modulation units 640 modulate the error-correction encoded data. In this case, the modulation units 640 may perform orthogonal frequency-division multiplexing (OFDM) modulation on the error-correction encoded data. The OFDM modulation will now be described. In the OFDM modulation, input data is classified into NM-array data symbols parallel to one another, and the data symbols are modulated by corresponding subcarriers, respectively. Then, the modulated results are added together to form an OFDM symbol. Here, the subcarriers are orthogonal to one another.

The D/A converters 650 convert digital data modulated by the modulation units 640 into analog data. The RF processing unit 660 performs RF up-conversion on the analog data received from the D/A converter 650, generates a certain RF signal, and transmits the certain RF signal to a wireless medium. In other words, the RF processing unit 660 transmits the encoded, uncompressed AV data which includes pixels to which error-correction encoding has been applied. Communication channels used by the RF processing unit 660 include a 60 GHz communication channel.

In FIG. 6, the apparatus 600 includes the channel coding units 630, the modulation units 640, and the D/A converters 650. However, the apparatus 600 may include one channel coding unit 630, one modulation unit 640, and one D/A converter 650 by inserting a separate multiplexing unit (not shown).

The system clock generation unit 670 generates a system clock of the apparatus 600. The channel coding units 630 perform their operations in response to the generated system clock. The frequency generation unit 680 generates a frequency used by the channel coding unit 630 and the modulation unit 640. Accordingly, the channel coding units 630 may perform error-correction encoding for each frequency channel in response to the same system clock, and the modulation units 640 may perform a modulation operation using the frequency generated by the frequency generation unit 680 as a carrier wave.

The system clock and the frequency respectively generated by the system clock generation unit 670 and the frequency generation unit 680 may be transmitted to the apparatus through the uncompressed AV data, which is transmitted by the RF processing unit 660, or a separate control packet. Accordingly, the apparatus maintains the same system clock and frequency phase as the error-correction encoding and modulation performed by the apparatus 600 in order to perform error-correction decoding and demodulation.

Figure 7:
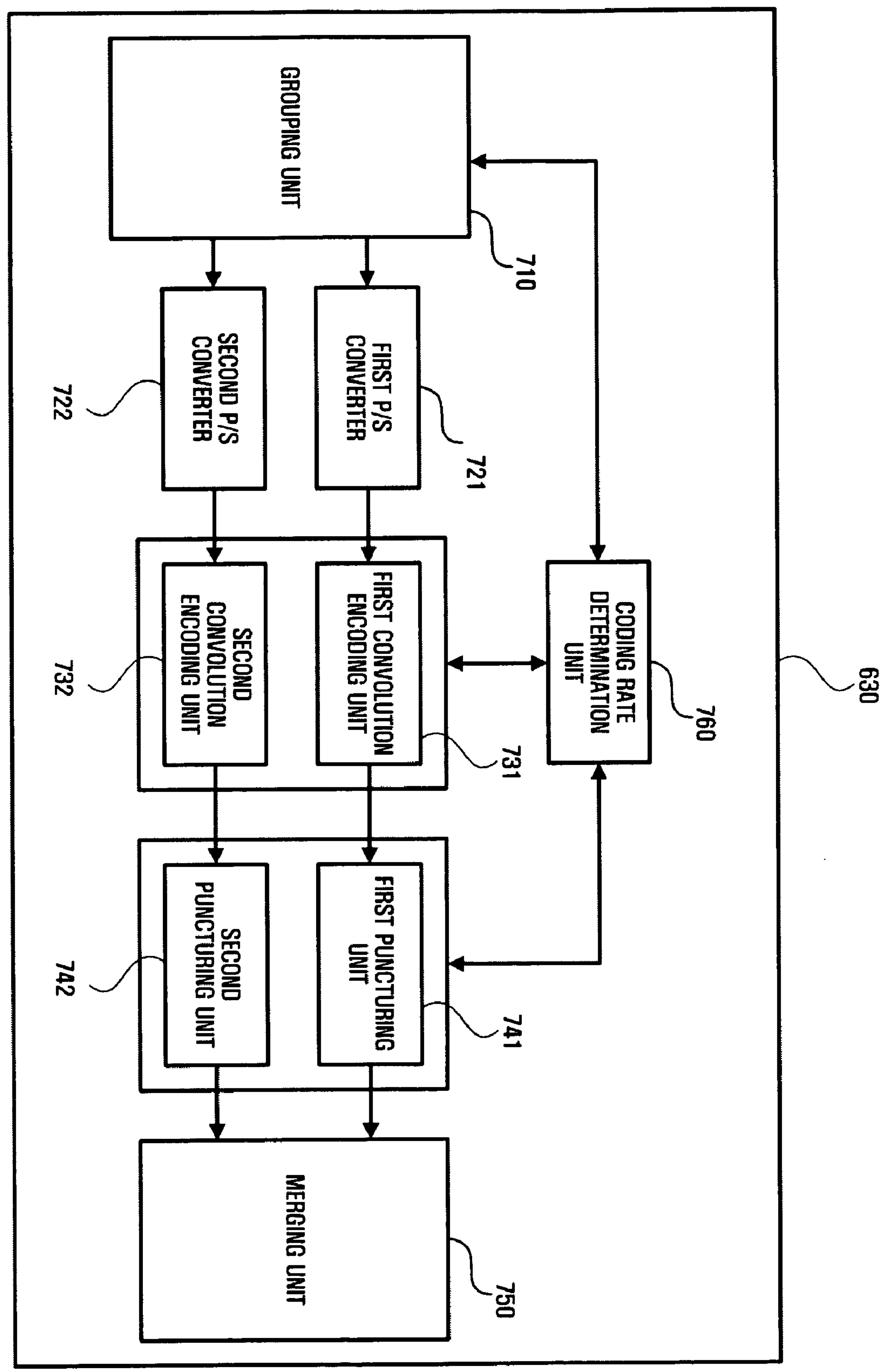
FIG. 7 is a detailed block diagram of a channel coding unit illustrated in FIG. 6.

FIG. 7 is a detailed block diagram of each of the channel coding units 630 illustrated in FIG. 6. Referring to FIG. 7, each of the channel coding units 630 includes a grouping unit 710, first and second parallel-to-serial (P/S) converters 721 and 722, first and second convolution encoding units 731 and 732, first and second puncturing units 741 and 742, and a merging unit 750.

The grouping unit 710 classifies bits of each pixel included in uncompressed AV data into at least two groups according to significance of the bits. For example, the grouping unit 710 may classify eight bit levels into three groups, i.e., a group of two bit levels and two groups of three bit levels from the highest to lowest bit levels, and a different coding rate may be applied to each group. Alternatively, the eight bit levels may be classified into two groups of four upper bit levels and four lower bit levels, respectively. Also, the eight bit levels may be classified into eight groups as illustrated in FIG. 5. The classification method may vary according to attributes of the uncompressed AV data that is to be transmitted and a transmission network environment.

For example, when the uncompressed AV data is to be transmitted to a large-sized display device, a ratio of a coding rate of an upper bit-level group to that of a lower bit-level group may be 4:4 in order to focus on relatively improving image representation. When the uncompressed AV data is to be transmitted to a device using a small-sized display, such as a mobile device, the ratio of the coding rates of the two groups may be 2:6 or 3:5 in order to focus on improving restoration capability of the upper bit-level group.

Hereinafter, a case where the grouping unit 710 classifies raw data into a group of four upper bit levels and a group of four lower bit levels will be described as an example.

Upper bits included in the group of four upper bit levels, which was classified by the grouping unit 710, are input to the first P/S converter 721, and lower bits included in the group of four lower bit levels are input to the second P/S converter 722.

The first and second P/S converters 721 and 722 convert parallel data of the four upper bit levels and that of four lower bit levels into serial data for error correction encoding.

The first and second convolution encoding units 731 and 732 perform error-correction encoding on the serial data using first and second coding rates, respectively. The error-correction coding includes block encoding and convolution encoding. In the present invention, convolution encoding will be used as an example. The first coding rate is smaller than the second coding rate applied to the four lower bit levels. For example, the first coding rate may be 1/3, and the second coding rate may be 2/3.

Figure 8:
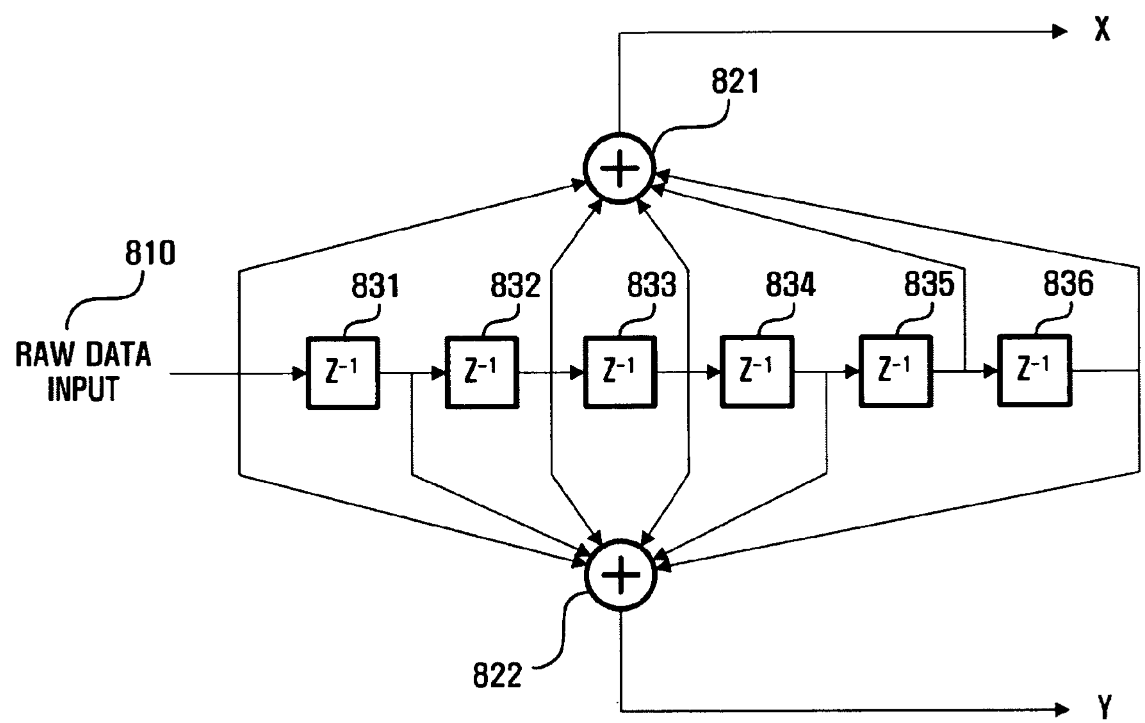
FIG. 8 is a diagram illustrating the configuration of first and second convolution encoding units having a basic coding rate of 1/2.

FIG. 8 is a diagram illustrating the configuration of the first and second convolution encoding units 731 and 732 having a basic coding rate of 1/2.

Referring to FIG. 8, the first and second convolution encoding units 731 and 732 include two adders 821 and 822 and six registers 831 through 836. The first and second convolution encoding units 731 and 732 require the registers 831 through 836 since a convolution encoding algorithm compares previous data with current data. Generally, the sum of the number of registers and the number of input raw data, that is, a value obtained after 1 is added to the number of registers is called a constraint length. Raw data 810 is input to the first and second convolution encoding units 731 and 732, and encoded data X and Y is output.

The first and second puncturing units 741 and 742 puncture some of the error-correction encoded bits. Puncturing denotes removing some of the bits encoded by the first and second convolution encoding units 731 and 732 in order to increase the transmission rate of the encoded bits. In this case, the removed bits are not transmitted. Since the puncturing process increases the transmission rate, more data can be transmitted. However, there is a higher probability of error occurrence when the bits punctured by the first and second convolution encoding units 731 and 732 are received.

When convolution encoding is used for error correction coding, a different coding rate is generated for each group of bit levels by removing a different number of bits from a plurality of bits included in each group.

Figure 9:
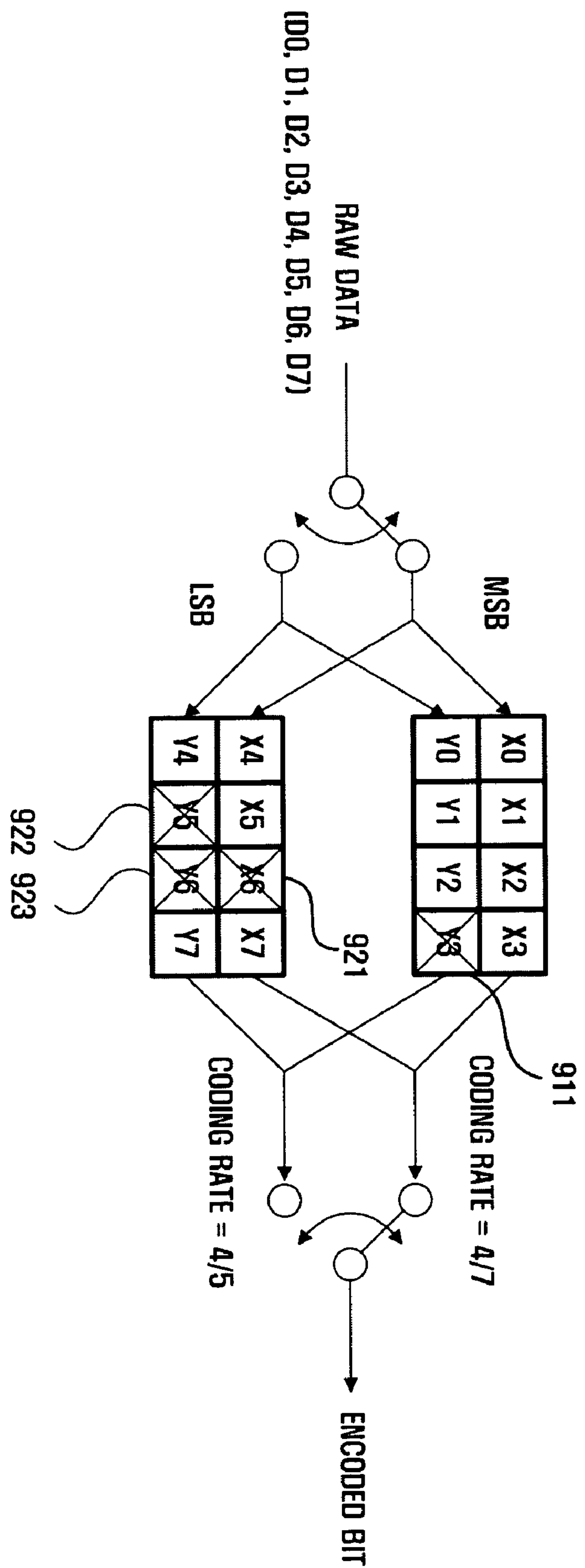
FIG. 9 is a diagram illustrating a puncturing process according to an exemplary embodiment of the present invention.

FIG. 9 is a diagram illustrating a puncturing process according to an exemplary embodiment of the present invention. Referring to FIG. 9, bits or groups of bits classified according to bit levels are converted by the first and second convolution encoding units 731 and 732 having a basic coding rate of 1/2 into codewords of bits X0 through X7 and Y0 through Y7, which are twice the raw data D0 through D7.

In FIG. 9, D0 through D3 indicate upper bits, and D4 through D7 indicate lower bits. The upper bits D0 through D3 are converted into the bits X0 through X3 and Y0 through Y3, and the lower bits D4 through D7 are converted into the bits X4 through X7 and Y4 through Y7. In other words, bits output from the first convolution encoding unit 731 are X0 through X3 and Y0 through Y3, and bits output from the second convolution encoding unit 732 are X4 through X7 and Y4 through Y7.

The first and second puncturing units 741 and 742 simultaneously perform the puncturing process through a switching operation.

The first puncturing unit 741 removes some, i.e., a bit 911, of the bits X0 through X3 and Y0 through Y3, thereby converting the coding rate from 2/1 to 4/7. In other words, since the number of pieces of the input raw data is four (D0 through D3) and the number of pieces of output data is seven (X0 through X3 and Y0 through Y2), the coding rate applied to the upper bits is 4/7. In FIG. 9, bits marked by 'X' denote punctured bits.

The second puncturing unit 742 also removes some 921 through 923 of the bits X4 through X7 and Y4 through Y7, thereby converting the coding rate from 2/1 to 4/5. In other words, since the number of pieces of the input raw data is four D4 through D7, and the number of pieces of output data is five (X4, X5, X7, Y4 and Y7), the coding rate applied to the lower bits is 4/5.

The puncturing processes performed by the first and second puncturing units 741 and 742 may be stored as a series of algorithms and may be applied to all input bits so that an identical coding rate can be output. For example, the first puncturing unit 741 may remove the bit 911 at the position of Y3 from the upper bits as illustrated in FIG. 9 or another bit. In so doing, the first puncturing unit 741 can convert the coding rate of the upper bits into 4/7. The second puncturing unit 742 may remove the bits 921 through 923 at the positions of X6, Y5 and Y6 from the lower bits as illustrated in FIG. 9 or other three bits. In so doing, the second puncturing unit 742 can convert the coding rate of the lower bits into 4/5.

In other words, the first and second puncturing units 741 and 742 may remove bits at particular positions to produce an identical coding rate.

If the first and second coding rates (for example, 4/7 and 4/5, respectively) can be obtained directly by the first convolution encoding unit 731 and the second convolution unit 723, the puncturing process described above may be omitted.

To this end, each of the channel coding units 630 may include a coding rate determination unit 760. The coding rate determination unit 760 determines a coding rate with reference to the number of groups generated by the grouping unit 710. For example, if the error correction encoding is convolution encoding and there are two groups of bits, the coding rate determination unit 760 determines a coding rate of whichever of the two groups is more significant to be 4/7 and a coding rate of whichever of the two groups is less significant to be 4/5 by adjusting an input/output rate of the first and second convolution encoding units 731 and 732 or adjusting the puncturing process of the first and second puncturing units 741 and 742.

In addition, if error correction encoding is block encoding, the first and second coding rate may be generated differently for a bit or group of bits of each bit level by setting a different parity byte size for the bit or group of bits of each bit level.

Finally, the merging unit 750 merges the encoded data of the upper bit levels and the encoded data of the lower bit levels and generates a payload, i.e., a MAC protocol data unit (MPDU).

Given the number of bits input to the channel coding unit 630 and the number of bits output from the first and second convolution encoding units 731 and 732, since the number of bits initially input to the channel coding unit 630 is 8, and the number of bits output from the first and second convolution encoding units 731 and 732 is 12 (=7+5), the overall coding rate is 2/3 (=8/12). In other words, performing error correction encoding using the overall coding rate of 2/3 according to the present embodiment may seem identical to performing error correction encoding using a coding rate of 2/3. However, since different coding rates are applied to bits according to significance thereof, the error correction encoding method according to the present exemplary embodiment shows superior error correction capabilities to the related art error correction encoding method simply using the coding rate of 2/3.

Figure 10:
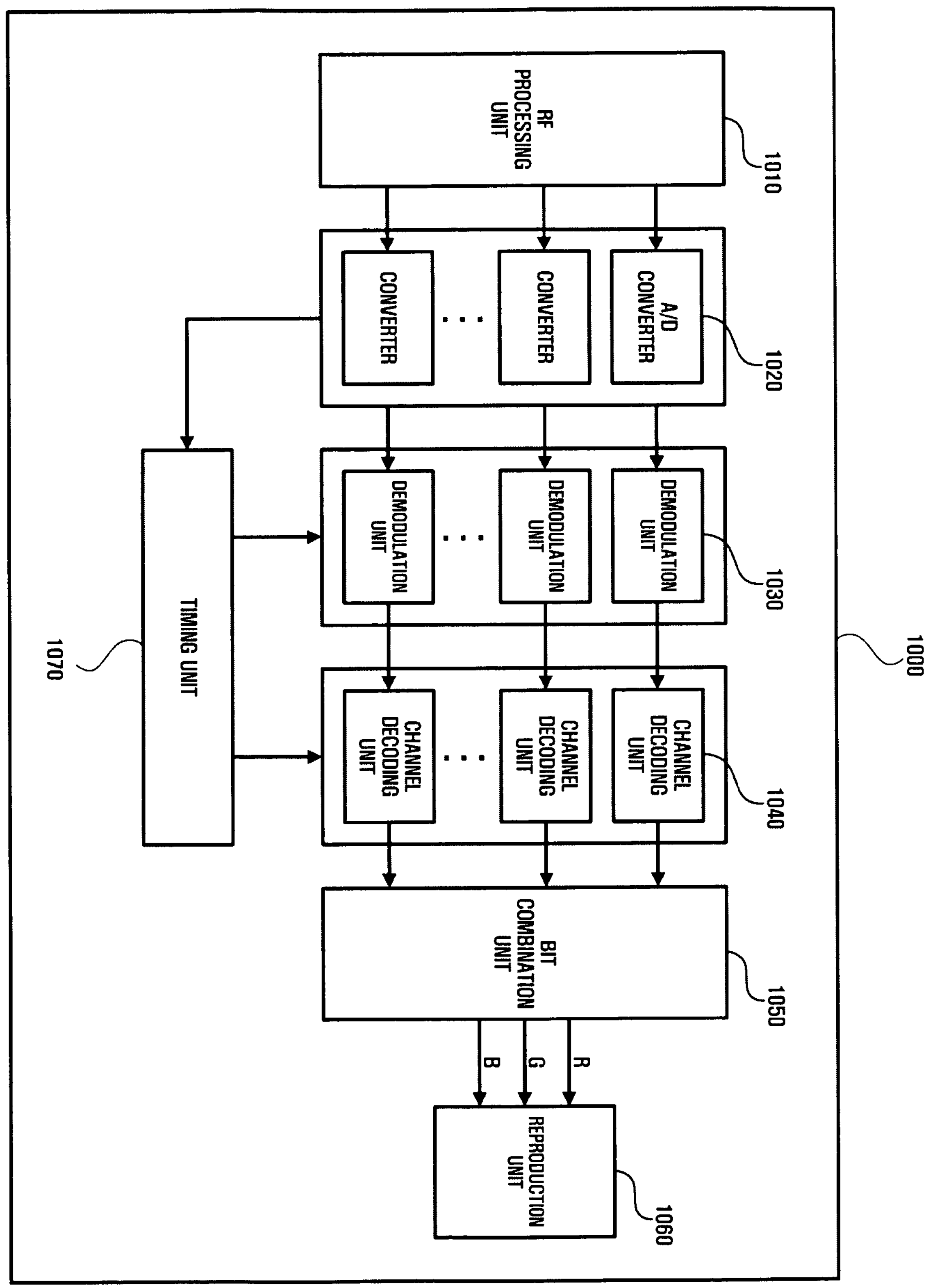
FIG. 10 is a block diagram of an apparatus for receiving uncompressed AV data according to an exemplary embodiment of the present invention.

FIG. 10 is a block diagram of the apparatus 1000 for receiving uncompressed AV data according to an exemplary embodiment of the present invention. Referring to FIG. 10, the apparatus 1000 includes an RF processing unit 1010, a plurality of analog-to-digital (A/D) converters 1020, a plurality of demodulation units 1030, a plurality of channel decoding units 1040, a bit combination unit 1050, a reproduction unit 1060, and a timing unit 1070.

The RF processing unit 1010 receives, though a certain communication channel, uncompressed AV data that is composed of pixels including bits which were classified into at least two groups according to significance of the bits and to each group of which a different coding rate was applied. Communication channels used by the RF processing unit 1010 include a 60 GHz communication channel.

The A/D converters 1020 convert analog data received from the RF processing unit 1010 into digital data.

The demodulation units 1030 perform OFDM demodulation on the digital data received from the A/D converters 1020.

The channel decoding units 1040 perform error correction decoding on data of each group, which was encoded using a different coding rate, by using the corresponding coding rate. This error correction decoding is a reverse process of the error correction encoding performed by the channel coding units 630. In the error correction decoding, an n-bit codeword is restored into k-bit raw data. The channel decoding units 1040 may check a field of a PHY header in order to identify a coding rate applied to the encoded data.

For example, if the first and second coding rates used by the apparatus 600 and the apparatus, 1000 are fixed, the channel decoding units 1040 may perform error correction decoding using the fixed first and second coding rates. However, if the first and second coding rates used by the two apparatuses 600 and 1000 are not fixed, the apparatus 600 inserts modes having different coding rates into a certain field of the PHY header. Therefore, the channel decoding units 1040 identify the modes in the certain field and perform error correction decoding using the first and second coding rates corresponding to the identified modes. To this end, the apparatus 1000 may include a storage unit (not shown) storing modes and coding rates corresponding to the modes.

The bit combination unit 1050 combines bits output from the channel decoding units 1040 according to bit levels (from the MSB to LSB), restores each sub-pixel component, and generates decoded, uncompressed AV data. Each sub-pixel component (e.g., an R, G or B component) restored by the bit combination unit 1050 is provided to the reproduction unit 1060.

The reproduction unit 1060 collects each sub-pixel component, i.e., pixel data, and, if one video frame is completed, displays the completed video frame on a display device (not shown), such as a cathode ray tube (CRT), a liquid crystal display (LCD) or a plasma display panel (PDP), in response to a reproduction synchronization signal.

The timing unit 1070 identifies a system clock and a frequency of the apparatus 600 received through the uncompressed AV data or a separate control packet and generates a system clock and a frequency corresponding to the received system clock and frequency. The system clock and frequency generated by the timing unit 1070 are transmitted to the demodulation units 1030 and the channel decoding units 1040. Accordingly, the demodulation units 1030 and the channel decoding units 1040 maintain the same system clock and frequency phase as the error correction encoding and modulation performed by the apparatus 600 in order to perform error correction decoding and demodulation.

Figure 11:
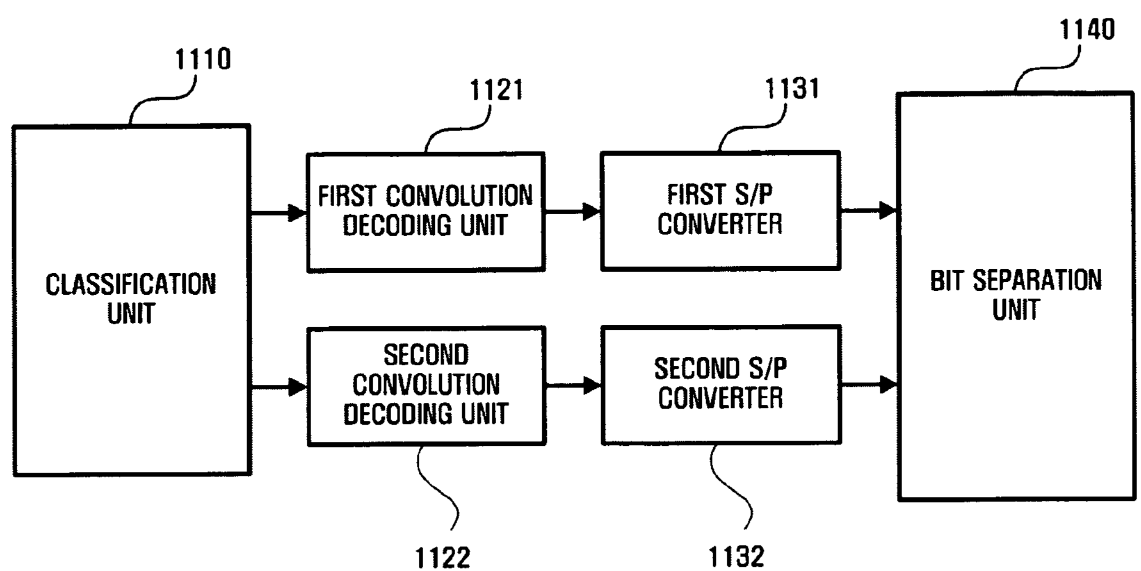
FIG. 11 is a detailed block diagram of a channel decoding unit illustrated in FIG. 10.

FIG. 11 is a detailed block diagram of each of the channel decoding units 1040 illustrated in FIG. 10. Each of the channel decoding unit 1040 includes a classification unit 1110, first and second convolution decoding units 1121 and 1122, first and second serial-to-parallel (S/P) converters 1131 and 1132, and a bit separation unit 1140.

The classification unit 1110 classifies a payload of a transmission packet into data of each group and provides the data of each group to the first and second convolution decoding units 1121 and 1122.

The first convolution decoding unit 1121 performs convolution decoding on encoded data of a first group, which is relatively more significant, using the first coding rate. The first coding rate is smaller than the second coding rate applied to decoding performed by the second convolution decoding unit 1122. Due to this differential decoding, relatively more significant bits are more likely to be restored than relatively less significant bits. Even if the restoration of the relatively less significant bits fails, it does not greatly affect the quality of content restored.

Data decoded by the first convolution decoding unit 1121 is provided to the first S/P converter 1131. The first S/P converter 1131 converts the decoded serial data into parallel data.

Similarly, encoded data of a second group, which was classified by the classification unit 1110, is provided to the bit separation unit 1140 via the second convolution decoding unit 1122 and the second S/P converter 1132.

The bit separation unit 1140 temporarily stores the parallel data received from the first S/P converter 1131 and the second S/P converter 1132 and outputs bits $Bit_0$ through $Bit_{m-1}$ for each bit level in a synchronized manner.

Uncompressed video data has been used above as an example of AV data. However, it may be fully understood by those of ordinary skill in the art that the same transmission/reception method can be applied to uncompressed audio data such as a wave file.

As described above, apparatuses and methods for transmitting and receiving uncompressed AV data apply a different coding rate to each bit or each group of bits included in the uncompressed AV data according to significance of each bit or each group of bits when transmitting and receiving the uncompressed AV data over a wireless network. Therefore, the stability and efficiency of data transmission can be enhanced.

While the present invention has been particularly shown and described with reference to certain exemplary embodiments thereof, it will be understood by those of ordinary skill in the art that various changes in form and details may be made therein without departing from the spirit and scope of the present invention as defined by the following claims. The exemplary embodiments should be considered in descriptive sense only and not for purposes of limitation.

What is claimed is:

1. An apparatus for transmitting uncompressed audio or video (AV) data, the apparatus comprising:

a bit separation unit which distributes the uncompressed AV data to a plurality of frequency channels;

at least one grouping unit which classifies bits of each pixel included in uncompressed AV data distributed to at least one of the plurality of frequency channels into at least two groups of bits according to a significance of the bits;

at least one encoding unit which performs error correction encoding on each of the at least two groups using a different coding rate and based on a frequency generated for the at least one of the plurality of frequency channels;

at least one modulation unit which performs a modulation operation based on the frequency used as a carrier wave frequency; and a radio frequency (RF) processing unit which transmits the encoded, uncompressed AV data, which includes the pixels on which the error-correction encoding was performed, using a communication channel.

2. The apparatus of claim 1, wherein the significance of the bits is determined based on bit levels of the bits.

3. The apparatus of claim 1, wherein the error correction encoding comprises at least one of convolution encoding and block encoding.

4. The apparatus of claim 3, wherein, if the error correction encoding is the convolution encoding, a different coding rate is generated for each of the at least two groups of bits by removing a different number of bits from a plurality of bits included in each of the at least two groups.

5. The apparatus of claim 3, wherein, if the error correction encoding is the block encoding, a different coding rate is generated for each of the at least two groups of bits by setting a different parity byte size for each of the at least two groups.

6. The apparatus of claim 1, further comprising a coding rate determination unit which determines the coding rate with reference to a number of groups.

7. The apparatus of claim 6, wherein, if the error correction encoding is the convolution encoding and if there are two groups of bits, the coding rate determination unit determines a coding rate of whichever of the two groups is more significant to be 4/3 and the coding rate of whichever of the two groups is less significant to be 4/5.

8. The apparatus of claim 1, further comprising:

a system clock generation unit which generates a system clock used for the error correction encoding; and a frequency generation unit which generates the frequency for the at least one of the plurality of frequency channels used for the error correction encoding and for the modulation operation that uses the frequency as the carrier wave frequency and that is performed to transmit the encoded, uncompressed AV data.

9. The apparatus of claim 8, wherein an apparatus for receiving the uncompressed AV data performs error correction decoding and demodulation, which is a reverse process of the modulation, by maintaining the system clock and a phase of the frequency.

10. The apparatus of claim 1, wherein the communication channel comprises a 60 GHz communication channel.

11. An apparatus for receiving uncompressed audio or video (AV) data, the apparatus comprising:

a radio frequency (RF) processing unit which receives, through a communication channel, the uncompressed AV data being distributed to a plurality of frequency channels and comprising pixels including bits which were classified into at least two groups of bits according to a significance of the bits, wherein each of the at least two groups has a different coding rate and is encoded based on a frequency generated for at least one of the plurality of frequency channels;

at least one decoding unit which performs different error correction decoding on each of the at least two groups using the coding rate and based on the frequency generated for the at least one of the plurality of frequency channels;

at least one demodulation unit which performs a demodulation operation based on the frequency used as a carrier wave frequency; and a bit combination unit which combines the at least two groups on which the error correction decoding was performed and generates decoded, uncompressed AV data.

12. The apparatus of claim 11, wherein the significance of the bits is determined based on bit levels of the bits.

13. The apparatus of claim 11, wherein the error correction decoding comprises at least one of convolution decoding and block decoding.

14. The apparatus of claim 11, wherein the bit combination unit combines the bits included in the at least two groups, on which the error correction decoding was performed, according to bit levels and generates the decoded, uncompressed AV data.

15. The apparatus of claim 11, further comprising a timing unit which generates a system clock and the frequency generated for the at least one of the plurality of frequency channels with reference to information included in the uncompressed AV data.

16. The apparatus of claim 15, wherein the decoding unit performs the error correction decoding by maintaining the generated system clock and a phase of the frequency.

17. The apparatus of claim 11, wherein the communication channel comprises a 60 GHz communication channel.

18. A method of transmitting uncompressed audio or video (AV) data, the method comprising:

distributing the uncompressed AV data to a plurality of frequency channels;

classifying bits of each pixel included in uncompressed AV data distributed to at least one of the plurality of frequency channels into at least two groups of bits according to a significance of the bits;

performing error correction encoding on each of the at least two groups using a different coding rate and based on a frequency generated for the at least one of the plurality of frequency channels;

performing a modulation operation based on the frequency used as a carrier wave frequency; and transmitting the encoded, uncompressed AV data, which includes the pixels on which the error-correction encoding was performed, using a communication channel.

19. The method of claim 18, wherein the significance of the bits is determined based on bit levels of the bits.

20. The method of claim 18, wherein the error correction encoding comprises at least one of convolution encoding and block encoding.

21. The method of claim 20, wherein, if the error correction encoding is the convolution encoding, a different coding rate is generated for each of the at least two groups of bits by removing a different number of bits from a plurality of bits included in each of the at least two groups.

22. The method of claim 20, wherein, if the error correction encoding is the block encoding, a different coding rate is generated for each of the at least two groups of bits by setting a different parity byte size for each of the at least two groups.

23. The method of claim 18, comprising determining the coding rate with reference to a number of groups.

24. The method of claim 23, wherein, if the error correction encoding is the convolution encoding and if there are two groups of bits, the determining of the coding rate comprises determining a coding rate of whichever of the two groups is more significant to be 4/3 and determining the coding rate of whichever of the two groups is less significant to be 4/5.

25. The method of claim 18, further comprising:

generating a system clock used for the error correction encoding; and generating the frequency for the at least one of the plurality of frequency channels used for the error correction encoding and for the modulation operation that uses the frequency as the carrier wave frequency and that is performed to transmit the encoded, uncompressed AV data.

26. The method of claim 25, wherein an apparatus for receiving the uncompressed AV data performs error correction decoding and demodulation, which is a reverse process of the modulation, by maintaining the system clock and a phase of the frequency.

27. The method of claim 18, wherein the communication channel comprises a 60 GHz communication channel.

28. A method receiving uncompressed audio or video (AV) data, the method comprising:

receiving, through a communication channel, the uncompressed AV data, being distributed to a plurality of frequency channels and being encoded based on a frequency generated for at least one of the plurality of frequency channels, comprised of pixels which includes bits that were classified into at least two groups of bits according to a significance of the bits and to each group of which a different coding rate was applied;

performing different error correction decoding on each of the at least two groups using the different coding rate and based on the frequency generated for the at least one of the plurality of frequency channels;

performing a demodulation operation based on the frequency used as a carrier wave frequency; and combining the at least two groups on which the error correction decoding was performed and generating decoded, uncompressed AV data.

29. The method of claim 28, wherein the significance of the bits is determined based on bit levels of the bits.

30. The method of claim 28, wherein the error correction decoding comprises at least one of convolution decoding and block decoding.

31. The method of claim 28, wherein the combining of the at least two groups and generating of the decoded, uncompressed data comprises combining the bits included in the at least two groups, on which the error correction decoding was performed, according to bit levels and generating the decoded, uncompressed AV data.

32. The method of claim 28, further comprising generating a system clock and the frequency generated for the at least one of the plurality of frequency channels with reference to information included in the uncompressed AV data.

33. The method of claim 32, wherein the performing of the different error correction decoding comprises performing the error correction decoding by maintaining the generated system clock and a phase of the frequency.

34. The method of claim 28, wherein the communication channel comprises a 60 GHz communication channel.

* * * * *